(12) United States Patent
Miller et al.

(10) Patent No.: US 6,448,804 B2
(45) Date of Patent: Sep. 10, 2002

(54) CONTACTLESS TOTAL CHARGE MEASUREMENT WITH CORONA

(76) Inventors: Tom G. Miller, 7077 Fox Hill Dr., Solon, OH (US) 44139; Roger L. Verkuil, 37 Sherwood Hts., Wappinger Falls, NY (US) 12590; Gregory S. Horner, 3717 Carlysle Ave., Santa Clara, CA (US) 95051

( * ) Notice: Subject to any disclaimer, the term of this patent is extended or adjusted under 35 U.S.C. 154(b) by 54 days.

(21) Appl. No.: 09/964,944

(22) Filed: Sep. 27, 2001

Related U.S. Application Data

(62) Division of application No. 09/749,485, filed on Dec. 26, 2000, which is a division of application No. 08/912,697, filed on Aug. 18, 1997, now Pat. No. 6,191,605.

(51) Int. Cl.⁷ .............................................. G01R 31/26
(52) U.S. Cl. ...................................... 324/765; 324/455
(58) Field of Search ................................ 324/765, 766, 324/767, 750, 751, 752, 753, 158.1, 455, 458

(56) References Cited

U.S. PATENT DOCUMENTS

| 4,812,756 A | 3/1989 | Curtis et al. ................ 324/750 |
| 5,216,362 A | 6/1993 | Verkuil ........................ 324/767 |
| 5,498,974 A | 3/1996 | Verkuil et al. ............... 324/767 |
| 5,773,989 A | 6/1998 | Edelman et al. ............. 324/765 |
| 5,834,941 A | 11/1998 | Verkuil ........................ 324/455 |
| 6,037,797 A | 3/2000 | Lagowski et al. ........... 324/766 |
| 6,097,196 A | 8/2000 | Verkuil et al. ............... 324/750 |
| 6,191,605 B1 | 2/2001 | Miller et al. ................. 324/767 |
| 6,249,117 B1 * | 6/2001 | Koelsch et al. ........... 324/158.1 |

OTHER PUBLICATIONS

John Bickley, "Quantox Non–Contact Oxide Monitoring System", A Keithley Technology Paper, 1995, 6 Pages. (No Month Available).

Gregory S. Horner, Meindert Kleefstra, Tom G. Miller, Michael A. Peters, "Monitoring Electrically Active Contaminants to Assess Oxide Quality", Solid State Technology, Jun. 1995, 4 Pages.

* cited by examiner

*Primary Examiner*—Safet Metjahic
*Assistant Examiner*—Russell M. Kobert
(74) *Attorney, Agent, or Firm*—Pearne & Gordon LLP

(57) ABSTRACT

A method of measuring total charge of an insulating layer on a semiconductor substrate includes applying corona charges to the insulating layer, and measuring a surface photovoltage of the insulating layer after applying each of the corona charges. The charge density of each of the corona charges is measured with a coulombmeter. A total corona charge required to obtain a surface photovoltage of a predetermined fixed value is determined and used to calculate the total charge of the insulating layer. The fixed value corresponds to either a flatband or midband condition.

2 Claims, 3 Drawing Sheets

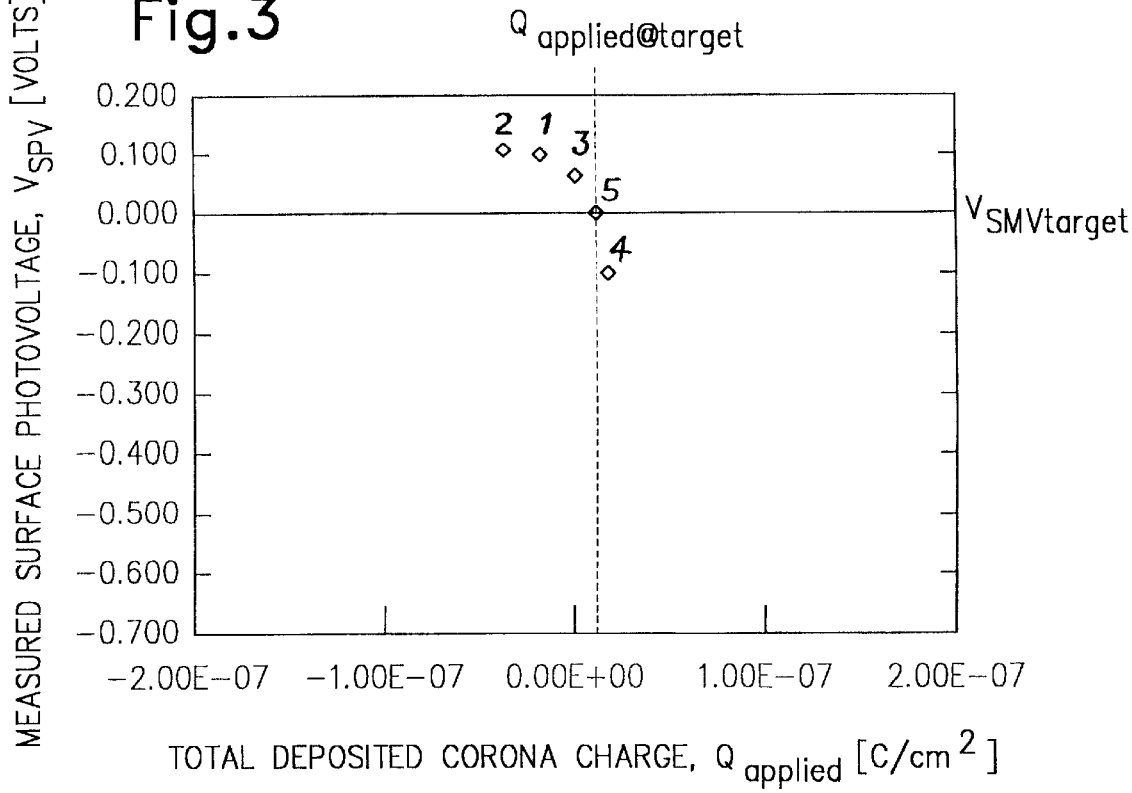
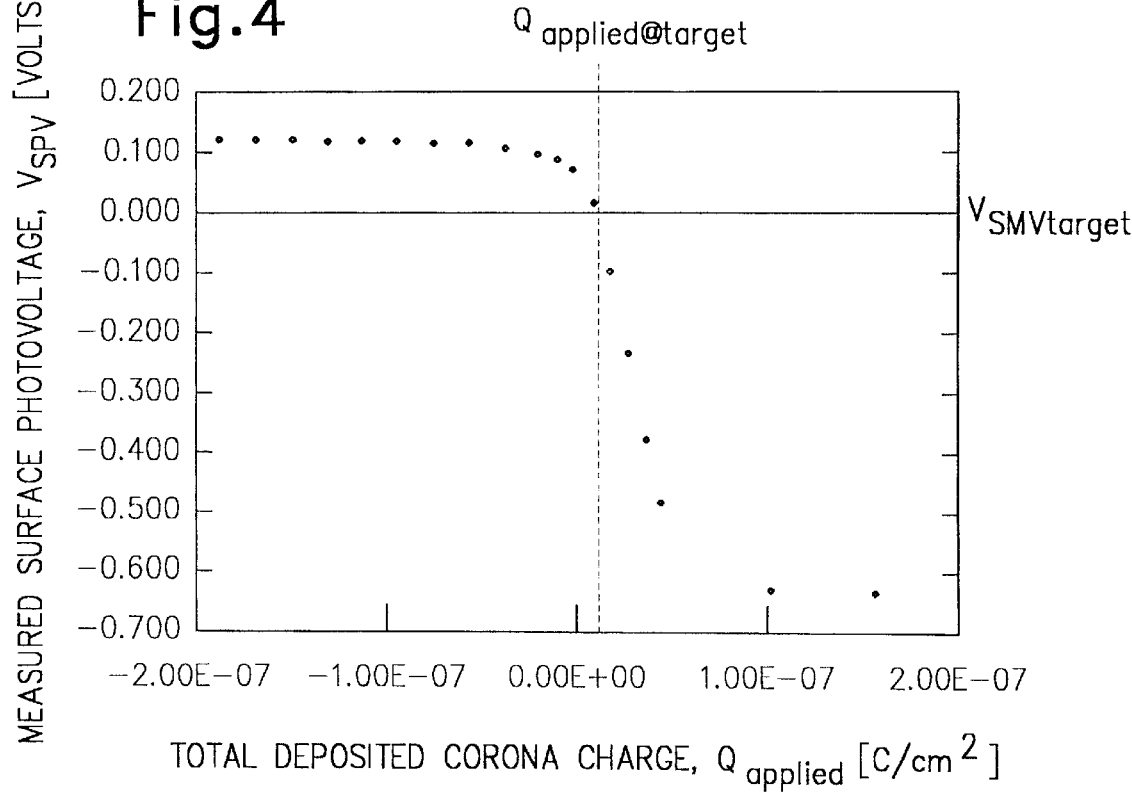

CONTACTLESS TOTAL CHARGE MEASUREMENT WITH CORONA

This application is a divisional application of U.S. patent application Ser. No. 09/749,485, filed Dec. 26, 2000, now pending which was a divisional application of U.S. patent application Ser. No. 08/912,697, filed Aug. 18, 1997, now issued U.S. Pat. No. 6,191,605.

BACKGROUND OF THE INVENTION

The present invention generally relates to testing a semiconductor wafer and, more particularly, to measuring a total charge of an insulating layer of the semiconductor wafer using corona charge.

The production of insulating layers, particularly, thin oxide layers, is basic to the fabrication of integrated circuit devices on semiconductor wafers. A variety of insulating dielectric layers are used for a wide range of applications. These insulating layers can be used, for example, to separate gate layers from underlying silicon gate regions, as storage capacitors in DRAM circuits, for electrical device isolation and to electrically isolate multilayer metal layers.

The devices, however, are very sensitive to induced charges near the silicon surface. In most cases, device performance depends strongly on the concentration of free charges in the silicon. As a result, unwanted variations in device performance can be introduced by charges in the insulating layer and the insulating layer interface. The charges can result, for example, from static charging of the insulating layer surface, poorly forming the insulating layer, excessive ionic contamination within the insulating layer, and metallic contamination within the insulating layer. In addition to degradation of device performance, electrical isolation of individual devices can be impaired by unwanted surface channels due to induced charges. A property of increasing interest, therefore, is total charge $Q_{tot}$ or sometimes referred to as net charge $Q_{net}$ of the insulating layer.

As illustrated in FIG. 1, there are five principle components of the total charge $Q_{tot}$ of an oxide layer: surface charge $Q_s$; mobile charge $Q_m$; oxide trapped charge $Q_{ot}$; fixed charge $Q_f$; and interface trapped charge $Q_{it}$. The surface charge $Q_s$ is charge on the top surface of the oxide layer and is frequently static charge or charged contaminants such as metallics. The mobile charge $Q_m$ is ionic contamination in the oxide layer such as potassium, lithium, or sodium trapped near the air/$SiO_2$ interface or the Si/$SiO_2$ interface. The oxide trapped charge $Q_{ot}$ is electrons or holes trapped in the bulk oxide. The fixed charge $Q_f$ is charge at the Si/$SiO_2$ interface. The interface trapped charge $Q_{it}$ varies as a function of bias condition.

Conventional methods of determining the total charge $Q_{tot}$ of an oxide layer include capacitance-voltage (CV), surface photovoltage (SPV) with biasing, and SPV analysis. The CV method typically measures each of the individual component charges, except the surface charge $Q_s$ which can be measured by the CV method, with a metal contact formed on the surface of the oxide layer and then obtains the total charge $Q_{tot}$ by summing up the individual component charges. The SPV with biasing method uses a contacting probe separated from the oxide layer with a Mylar insulator to bias the semiconductor. The total charge $Q_{tot}$ is determined by measuring the required bias of the probe to force a certain SPV. The SPV analysis method takes SPV measurements and infers the total charge $Q_{tot}$ via theoretical modeling.

While these methods may obtain the total charge $Q_{tot}$, they each have drawbacks. The CV method requires expensive and time consuming sample preparation. The SPV with biasing method requires a contacting probe which can allow charge transfer from the oxide layer to the probe. The SPV analysis method relies on theoretical modeling and may not be extremely accurate. Additionally, the SPV methods only work over a narrow range of total charge $Q_{tot}$, when the semiconductor is in depletion. Accordingly, there is a need in the art for an improved method of measuring the total charge of an insulating layer which is contactless, is a direct measurement with no theoretical modeling, is sensitive over a wide range of total charge, and is extremely accurate.

BRIEF SUMMARY OF THE INVENTION

The present invention provides a method for measuring a total charge of an insulating layer on a substrate which overcomes at least some of the disadvantages of the above-noted related art. According to the present invention, the method includes depositing corona charges on the insulating layer and measuring a surface photovoltage for the insulating layer after depositing each of the corona charges. The method further includes determining a total corona charge required to obtain a surface photovoltage of a predetermined fixed value and using the total corona charge to determine the total charge.

According to one variation of the method according to the present invention, the total corona charge is determined by continuing to deposit the corona charges until the surface photovoltage measured is equal the fixed value. The total corona charge then corresponds to a sum of the corona charges deposited. According to another variation of the method according to the present invention, the total corona charge is determined using a data set of discrete points, preferably by interpolation. The discrete points include the surface photovoltages measured after each of the corona charges and corresponding total corona charges deposited to obtain each of the surface photovoltages.

BRIEF DESCRIPTION OF THE SEVERAL VIEWS OF THE DRAWING

These and further features of the present invention will be apparent with reference to the following description and drawings, wherein:

FIG. 3 is an exemplary graph illustrating how the total charge can be determined by incrementally depositing a corona charge until obtaining a surface photovoltage (SPV) equal to a fixed value; and FIG. 4 is an exemplary graph illustrating how the total charge can be determined by interpolating a data set of measured surface photovoltages (SPV) and associated total corona charge densities.

DETAILED DESCRIPTION OF PREFERRED EMBODIMENTS

Figure 1:
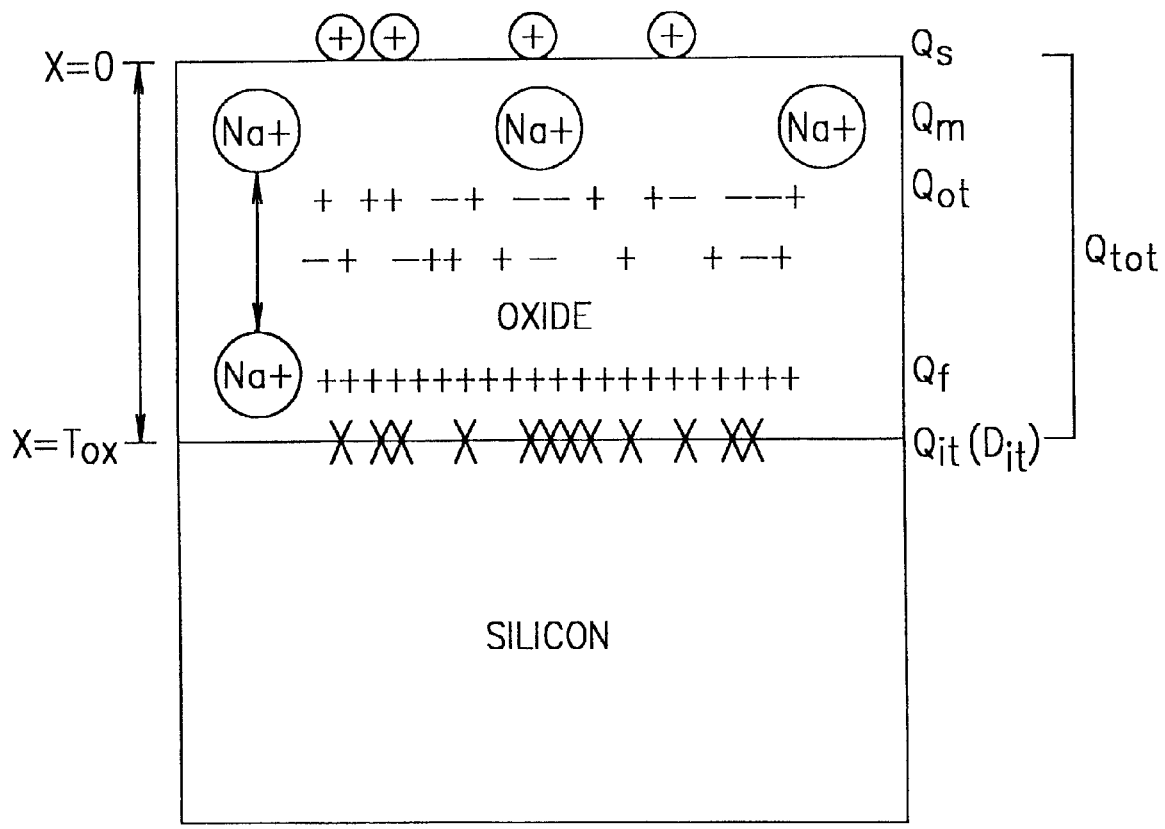
FIG. 1 a diagrammatic view of a semiconductor wafer illustrating principle components of a total charge of an insulating layer.

FIG. 1 illustrates an apparatus 10 for testing a semiconductor wafer 12 according to the present invention. The semiconductor wafer 12 includes a semiconductor substrate 14 and a dielectric or insulating layer 16 disposed on the substrate 14. The substrate 14 is typically a silicon substrate and the insulating layer 16 is typically an oxide layer.

However, it should be understood that the method of the present invention is applicable to a variety of insulating layers grown and/or deposited on substrates of semiconductor materials or metals. An air/dielectric interface 18 is formed at the top surface of the insulating layer 16 and a dielectric/substrate interface 20 is formed between the insulating layer 16 and the substrate 14. A measurement region 22 of the insulating layer 16 is selected to be tested by the apparatus 10.

The illustrated apparatus includes a wafer chuck 24 for holding the wafer 12 during testing, a contactless calibrated corona discharge source or gun 26 for depositing corona charges, a coulombmeter 28 for measuring deposited corona charges, an SPV device 30 for measuring surface photovoltages, a position actuator 34 for locating various components over the wafer 12, and a controller 36 for operating the apparatus 10. The wafer chuck 24 holds the wafer 12 during the measurement process and the wafer 12 is preferably secured to the wafer chuck 24 with a vacuum.

The corona gun 26 includes a non-contact corona-charge depositing structure such as one or more needles 38 and an electrode housing 40 which, along with the needles 38, focuses the corona discharge onto the measurement region 22 of the insulating layer 16. The needles 38 are preferably disposed a distance above the top surface 18 of the insulating layer 16 to minimize fringing effects and other causes of charge deposition non-uniformity. U.S. Pat. No. 5,498,974, expressly incorporated herein in its entirety by reference, discloses a suitable corona gun for depositing corona charge on an insulating layer and a suitable Kelvin probe for measuring the voltage on the surface of the layer.

The needles 38 are connected to a charge biasing means such as a high-voltage power supply 42 via a suitable line. The power supply 42 provides a desired high voltage output (e.g., +/−6–12 Kv) to the corona gun 26 to produce positive or negative corona charges depending on the polarity of the supply. The power supply 42 is suitably connected to the controller 36 via an appropriate signal line for feedback control of the power supply 42 during operation of the apparatus 10 as described in more detail hereinafter.

The coulombmeter 28 is used to measure the deposited corona charge and preferably includes a first operational amplifier or current-to-voltage converter 44 and a second operational amplifier or charge integrator 46. The input of current-to-voltage converter 44 is connected via a suitable signal line to the substrate 14 and the wafer chuck 24. A corona current $I_c$ flows from the corona gun 26 and through the wafer 12 to the current-to-voltage converter 44. This current $I_c$ is converted by the current-to-voltage converter 44 to a voltage and then integrated by the charge integrator 46 to generate a voltage proportional to the charge $Q_c$ deposited onto the insulating layer 16 by the corona gun 26. The outputs of the current-to-voltage converter 44 and the charge integrator 46 are each connected to the controller 36 via suitable signal lines to feed the current $I_{-c}$ and the deposited corona charge $Q_c$ information to the controller 36 during operation of the apparatus 10 as described in more detail hereinafter. Note that an electrical contact between the wafer 12 and the chuck 24 because the regulating displacement currents are sufficient to perform the measurement.

The SPV device 30 is used to measure surface photovoltages of the insulating layer 16 and preferably includes a very high intensity light source 48 such as, for example, a xenon flash tube. It is noted, however, that other types of SPV devices can be used such as, for example, LED, laser, or AC with lock-in.

The position actuator 34 is used to locate the corona gun 26, and the SPV device 30, over the measurement region 22 of the wafer 12. The position actuator is preferably a high-speed linear translator including a mobile carriage which selectively moves along a track disposed above the wafer chuck 24. The corona gun 26 and the SPV device 30, are each suitably spaced apart and attached to the carriage. A control unit is suitably connected to the controller 36 via an appropriate signal line for feed-back control during operation of the apparatus 10 as described in more detail hereinafter.

The controller 36 is used to control the operation of the apparatus 10 and preferably includes an input device 62 connected via a suitable line. The controller 36 controls the high-voltage power supply 42, the SPV device 30, the Kelvin control 54, and the position actuator control unit 60 and receives information from the current-to-voltage converter 44 and the current integrator 46. Based on the method set forth hereinbelow, the controller 36 can provide a measurement of total charge $Q_{tot}$ of the insulating layer 16. The controller 36 may be, for example, a dedicated microprocessor-based controller or a general purpose computer.

To obtain a total charge $Q_{tot}$ measurement for an insulating layer 16 of a semiconductor wafer 12 according to a first method of the present invention, the actuator preferably first locates the SPV device 30 over the measuring region 22 of the wafer 12 to obtain an initial SPV measurement $V_{SPV}$ of the insulating layer 16. The lamp 48 is flashed and a recording of a peak intensity of the SPV transient is captured by an A/D card of the controller 36. Because of the high intensity output of the lamp 48, a measurable SPV can be obtained in both in accumulation and in depletion or inversion. Note that other types of SPV devices such as, for example, LED, laser, or AC lock-in amplifier can be used.

The position actuator 34 next locates the corona gun 26 over the measuring region 22 of the wafer 12 to deposit a corona charge $Q_c$ on the measurement region 22 of the insulating layer 16. The controller 36 provides appropriate control signals for the corona gun 26 to deposit a corona charge $Q_c$. The corona charge $Q_c$ deposited on the insulating layer 16 is measured by the coulombmeter 28 and recorded by the controller 36.

The position actuator then locates the SPV device 30 over the measuring region 22 of the wafer 12 to again measure the SPV $V_{SPV}$ of the insulating layer 16. The SPV measurement $V_{SPV}$ is preferably recorded by the controller 36 and compared to a predetermined target value $V_{SPVtarget}$ stored in the controller 36. Preferably, the target value $V_{SPVtarget}$ is equal to a fixed value (0 volts) which indicates a "flatband condition". At flatband, no net charge is present on the insulating layer 16 and no space charge imaging is in the silicon substrate 14. It should be understood that the target value $V_{SPVtarget}$ can be equal to fixed values other than zero. For example, the target value $V_{SPVtarget}$ can be equal to a fixed value (typically about +/−0.300 V) which indicates a "Midband condition". At midband, the SPV $V_{SPV}$ is equal to the fixed value which depends on the doping of the particular substrate 14.

If the SPV measurement $V_{SPV}$ is not substantially equal to the target value $V_{SPVtarget}$, the above described steps of depositing the corona charge $Q_c$ and remeasuring the SPV are repeated. If the new SPV measurement $V_{SPV}$ changes beyond the target value $V_{SPVtarget}$ from the previous SPV measurement $V_{SPV}$, the controller 36 provides appropriate control signals for the corona gun 26 to reverse the polarity of the next deposited corona charge $Q_c$. Note that for a target value $V_{SPVtarget}$ of zero volts, a change in polarity from the previous SPV measurement to new SPV measurement indicates that the polarity of the next deposited corona charge $Q_c$ should be reversed. As required, the controller 36 can adjust the magnitude of the next deposited corona charge $Q_c$ to obtain an SPV measurement $V_{SPV}$ equal to the target value $V_{SPVtarget}$.

When the SPV measurement $V_{SPV}$ is substantially equal to the target value $V_{SPVtarget}$, the controller 36 sums each of the individual corona charge increments $Q_c$ to obtain a total corona charge $Q_{applied@target}$ applied to the insulating layer 16 to obtain the SPV measurement $V_{SPV}$ equal to the target value $V_{SPVtarget}$. The controller 36 then determines the total charge $Q_{tot}$ of the insulating layer 16 from the total applied corona charge $Q_{applied@target}$ wherein the total charge $Q_{tot}$ is the negative of the total applied corona charge $Q_{applied@target}$, i.e. $Q_{tot}=-Q_{applied@target}$.

FIG. 3 illustrates an example of this first method wherein the target value $V_{SPVtarget}$ is zero volts, or flatband condition. A first corona charge $Q_c$ of $-0.20E-07$ C/cm$_2$ is applied on the insulating layer and an SPV measurement $V_{SPV}$ of about 0.090 volts is obtained. A second corona charge $Q_c$ of $-0.20E^{-07}$ C/cm$_2$ is then applied on the insulating layer 16 such that the total corona charge $Q_{applied}$ is $-0.40E^{-07}$ C/cm$_2$. The second SPV measurement $V_{SPV}$ is about 0.100 volts. A third corona charge $Q_c$ $0.40E^{-07}$ C/cm$_2$ is applied on the insulating layer 16 such that the total corona charge $Q_{applied}$ is $0.00E^{-07}$ C/cM$_2$. The third SPV measurement $V_{SPV}$ is about 0.060 volts. Note that the polarity of the third deposited corona charge $Q_c$ was changed, because the SPV measurements $V_{SPV}$ were going away from the target value (zero) and the magnitude of the third deposited corona charge $Q_c$ was changed, specifically increased or doubled, to avoid duplicating the first measurement. A fourth corona charge $Q_c$ of $-0.20E^{-07}$ C/cm$_2$ is applied on the insulating layer 16 such that the total corona charge $Q_{applied}$ is $+0.20E^{-07}$ C/cm$_2$. The fourth SPV measurement $V_{SPV}$ is about $-0.100$ volts. A fifth corona charge $Q_c$ of $-0.10E^{-07}$ C/cm$_2$ is applied on the insulating layer 16 such that the total corona charge $Q_{applied}$ is $+0.10E^{-07}$ C/cm$_2$. The fifth sPv measurement $V_{SPV}$ is about 0.000 volts and substantially equal to the target value $V_{SPVtarget}$. Note that the polarity of the fifth deposited corona charge $Q_c$ was changed because the fourth SPV measurement $V_{SPV}$ went past the target value (zero) $V_{SPVtarget}$ and the magnitude of the fifth deposited corona charge $Q_c$ was changed, specifically reduced by half, to avoid duplicating the third measurement. Therefore, the total applied corona charge $Q_{applied@target}$ to obtain the target value $V_{SPVtarget}$ is $+0.10E^{-07}$ C/cm$_2$. The controller 36 then determines the total charge $Q_{tot}$ of the insulating layer is $+0.10E^{-07}$ C/cm$_2$.

In a second method of measuring the total charge $Q_{tot}$ of the insulating layer 16 according to the present invention, the position actuator 34 alternately locates the corona gun 26 and the SPV device 30 over the measuring region 22 of the wafer 12 to deposit increments of corona charge $Q_c$ on the insulating layer 16 and to obtain SPV measurements $V_{SPV}$ of the insulating layer 16. The controller 36 records each SPV measurement $V_{SPV}$ and determines and records the total corona charge $Q_{applied}$ applied to the insulating layer 16 to obtain that SPV measurement $V_{SPV}$. Therefore, a data set is obtained containing the plurality of SPV measurements $V_{SPV}$ along with the corresponding total applied corona charges $Q_{applied}$. The controller 36 then determines the total applied corona charge $Q_{applied@target}$ required for the SPV measurement $V_{SPV}$ to be substantially equal to the target value $V_{SPVtarget}$ from the data set. The value $Q_{applied@target}$ is preferably interpolated from the data set of discrete points. The controller 36 then determines the total charge $Q_{tot}$ of the insulating layer 16 from the total applied corona charge $Q_{applied@target}$ wherein the total charge $Q_{tot}$ is again the negative of the total applied corona charge $Q_{applied@target}$, i.e. $Q_{tot}=-Q_{applied@target}$ FIG. 4 illustrates an example of this second method wherein the target value $V_{SPVtarget}$ is zero volts, or flatband condition. A data set is obtained by incrementally depositing a plurality of corona charges $Q_C$ on the insulating layer and obtaining a SPV measurement $V_{SPV}$ for each incremental deposition. The illustrated data set contains 19 discrete points containing the SPV measurements $V_{SPV}$ and the corresponding total applied corona charges $Q_{applied}$. The controller 36 interpolates the discrete points to determine that the total applied corona charge $Q_{applied@target}$ at the target value $V_{SPVtarget}$ is about $+0.10E^{-07}$ C/cm$_2$. The controller 36 then determines the total charge $Q_{tot}$ of the insulating layer is $+0.10E^{-07}$ c/cm$_2$.

When the target value $V_{SPVtarget}$ is zero volts, each of the SPV measurements $V_{SPV}$ are preferably corrected with a small Dember Voltage correction in either of the methods. The Dember Voltage correction is a small "second order-"correction which can be applied via well known equations.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for measuring a total charge of an oxide layer on a semiconductor wafer, said method comprising the steps of:

(a) depositing a corona charge on the oxide layer;

(b) measuring a surface photovoltage of the oxide layer;

(c) determining a total corona charge density associated with said surface photovoltage;

(d) repeating steps (a) to (c) a plurality of times to obtain a data set of discrete points for the surface photovoltages and the total corona densities;

(e) using said data set to determine a total corona charge density corresponding to a surface photovoltage of a predetermined fixed value; and (f) using said total corona charge to determine the total charge of the oxide layer.

2. The method according to claim 1, wherein said step of using said data set includes interpolating said fixed value from said discrete points.

* * * * *

UNITED STATES PATENT AND TRADEMARK OFFICE
CERTIFICATE OF CORRECTION

Figure 2:
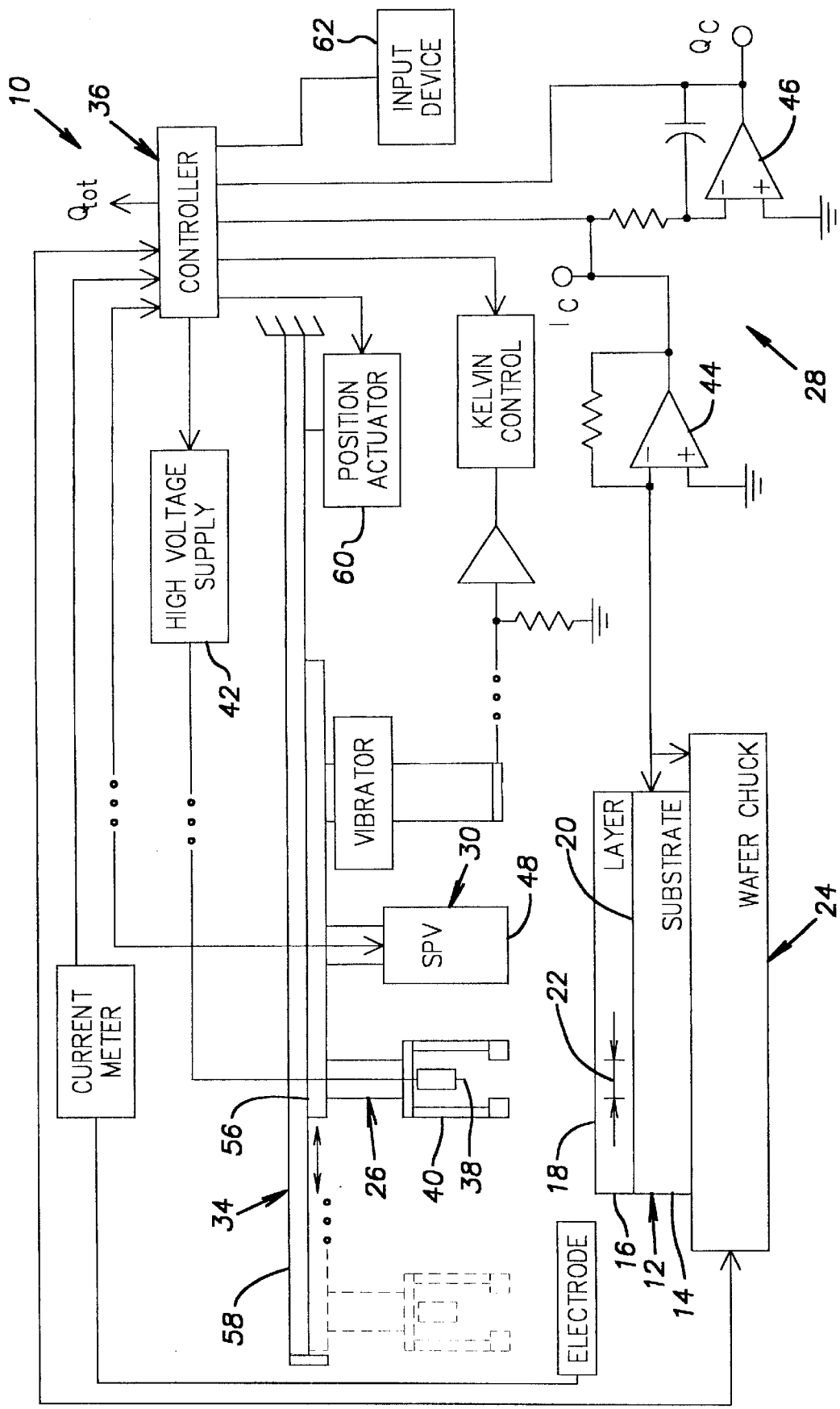
FIG. 2 a schematic diagram of an apparatus for measuring a total charge of an insulating layer according the present invention.

PATENT NO. : 6,448,804 B2  
DATED : September 10, 2002  
INVENTOR(S) : Tom G. Miller, Roger L. Verkuil and Gregory S. Horner It is certified that error appears in the above-identified patent and that said Letters Patent is hereby corrected as shown below:

Column 2,  
Line 44, please delete "FIG. 1 a" and insert therefore -- FIG. 1 is a --.  
Line 47, please delete "FIG. 2 a" and insert therefore -- FIG. 2 is a --.

Column 3,  
Line 56, please delete "$L_c$" and insert therefore -- $I_c$ --.

Column 5,  
Line 18, please delete "$Q_{applied@target}$, i.e. $Q_{tot}=-Q_{applied\Omega target}$," and insert therefore -- $Q_{applied@target}$, i.e. $Q_{tot}=-Q_{applied@target}$, --.  
Line 21, please delete "0.20E-07" and insert therefore -- $-0.20E^{-07}$ --.  
Line 27, please delete "$Q_c 0.40E^{-07}$" and insert therefore -- $Q_c$ of $+0.40E^{-07}$ --.  
Line 29, please delete "$C/cM_2$" and insert therefore -- $C/cm_2$ --.  
Line 36, please delete "$0.20E^{-07}$" and insert therefore -- $+0.20E^{-07}$ --.  
Line 36, please delete "$C/cm_2$ is -- and insert therefore -- $C/cm_2$ is --.  
Line 41, please delete "sPv" and insert therefore -- SPV --.

Column 6,  
Line 13, please delete "$Q_{applied@target}$i.e." and insert therefore -- $Q_{applied@target}$, i.e. --.  
Line 14, please delete "—$Q_{applied@target}$" and insert therefore -- —$Q_{applied@target}$, --.  
Line 26, please delete "$c/cm_2$" and insert therefore -- $C/cm_2$ --.  
Line 30, please delete ""second order" and insert therefore -- "second order" --.  
Line 31, please delete " " ".

Signed and Sealed this

Eighth Day of April, 2003

JAMES E. ROGAN  
*Director of the United States Patent and Trademark Office*